US012669541B2

(12) United States Patent
Dimroci et al.

(10) Patent No.: US 12,669,541 B2
(45) Date of Patent: Jun. 30, 2026

(54) ARCHITECTURE FOR TESTING MULTIPLE SCAN CHAINS

(71) Applicant: STMicroelectronics International N.V., Geneva (CH)

(72) Inventors: Enea Dimroci, Borgo San Dalmazzo (IT); Roberta Priolo, Milan (IT); Francesco Battini, Milan (IT)

(73) Assignee: STMicroelectronics International N.V., Geneva (CH)

( * ) Notice: Subject to any disclaimer, the term of this patent is extended or adjusted under 35 U.S.C. 154(b) by 87 days.

(21) Appl. No.: 18/540,198

(22) Filed: Dec. 14, 2023

(65) Prior Publication Data

US 2025/0199069 A1     Jun. 19, 2025

(51) Int. Cl.
    *G06F 30/32*      (2020.01)
    *G01R 31/317*     (2006.01)
    *G01R 31/3185*    (2006.01)
    *G06F 11/27*      (2006.01)

(52) U.S. Cl.
    CPC ................ *G01R 31/318536* (2013.01); *G01R 31/31725* (2013.01); *G01R 31/318525* (2013.01); *G01R 31/318544* (2013.01); *G06F 11/27* (2013.01); *G06F 30/32* (2020.01)

(58) Field of Classification Search
    CPC ...... G01R 31/318536; G01R 31/31725; G01R 31/318525; G06F 11/27; G06F 30/32
    See application file for complete search history.

(56) References Cited

U.S. PATENT DOCUMENTS

| | | | |
|---|---|---|---|
| 6,141,630 A | 10/2000 | Mcnamara et al. | |
| 6,182,268 B1 | 1/2001 | Mcelvain | |
| 6,226,774 B1 | 5/2001 | Sawasaki et al. | |

(Continued)

FOREIGN PATENT DOCUMENTS

| | | |
|---|---|---|
| CN | 1417970 A | 5/2003 |
| CN | 101553785 A | 10/2009 |

(Continued)

OTHER PUBLICATIONS

Dax, Mark "Inspection, Measurement and Test," Semiconductor International, 20.1: 44, Reed Business Information, a division of Reed Elsevier Inc., Jan. 1997, 1 page.

(Continued)

*Primary Examiner* — Mark D Featherstone
*Assistant Examiner* — Jeffrey Andrew Yang
(74) *Attorney, Agent, or Firm* — Slater Matsil, LLP

(57) ABSTRACT

According to an embodiment, a test system for serially testing of finite state machine circuits using scan chains is proposed. Each scan chain is coupled to a finite state machine circuit to test the finite state machine circuit coupled thereto. Each scan chain has a number of input terminals and one output terminal. The test system includes a dispatcher input interface with a number of input terminals and multiple sets of output terminals, where each set of output terminals includes multiple output terminals coupled to the input terminals of an associated scan chain. The test system further includes a dispatcher output interface with multiple input terminals and one output terminal. The output terminal of each scan chain is coupled to one of the input terminals of the dispatcher output interface.

20 Claims, 7 Drawing Sheets

(56)                References Cited

U.S. PATENT DOCUMENTS

| | | | |
|---|---|---|---|
| 6,389,586 B1 | 5/2002 | McElvain | |
| 6,487,704 B1 | 11/2002 | McNamara et al. | |
| 9,772,376 B1 | 9/2017 | Kawoosa et al. | |
| 10,310,994 B2 | 6/2019 | Stevens et al. | |
| 11,669,666 B1 | 6/2023 | John et al. | |
| 2003/0081708 A1 | 5/2003 | Gelke et al. | |
| 2003/0188243 A1 | 10/2003 | Rajan | |
| 2004/0095164 A1* | 5/2004 | Kernahan | G11C 27/02 |
| | | | 327/94 |
| 2004/0153926 A1 | 8/2004 | Abdel-Hafez et al. | |
| 2007/0204191 A1 | 8/2007 | Tailliet et al. | |
| 2008/0126718 A1 | 5/2008 | Kottke et al. | |
| 2008/0136448 A1 | 6/2008 | Ng | |
| 2009/0150706 A1 | 6/2009 | Oh et al. | |
| 2009/0164826 A1 | 6/2009 | Kottke | |
| 2012/0030532 A1 | 2/2012 | Jain | |
| 2012/0233514 A1 | 9/2012 | Patil | |
| 2014/0062606 A1 | 3/2014 | Sul et al. | |
| 2014/0129889 A1 | 5/2014 | Matsumoto | |
| 2017/0357505 A1 | 12/2017 | Berthier et al. | |
| 2018/0246819 A1 | 8/2018 | Stevens et al. | |
| 2018/0321311 A1 | 11/2018 | Kawoosa | |
| 2019/0094301 A1* | 3/2019 | Srinivasan | G01R 31/318538 |
| 2020/0124668 A1 | 4/2020 | Goel | |
| 2023/0204661 A1* | 6/2023 | Huang | G01R 31/318563 |
| | | | 324/537 |

| | | | |
|---|---|---|---|
| 2023/0228815 A1 | 7/2023 | Bhunia et al. | |
| 2023/0259433 A1 | 8/2023 | Dimroci | |
| 2024/0393394 A1* | 11/2024 | Yang | G01R 31/318544 |

FOREIGN PATENT DOCUMENTS

| | | |
|---|---|---|
| CN | 101915894 A | 12/2010 |
| CN | 104604131 A | 5/2015 |
| CN | 109196481 A | 1/2019 |

OTHER PUBLICATIONS

Henrik Hulgaard et al., "Testing asynchronous circuits: A survey," Integration, The VLSI Journal, Nov. 1, 1995, 21 pages, vol. 19, No. 3, Elsevier.

Jari Pasanen et al., "Locally Clocked AFSMs with Dynamic Latch Implementation," 6th IEEE International Conference on Electronics, Circuits and Systems, Sep. 5-8, 1999, 4 pages, vol. 3, IEEE.

Sana Rao et al., "A Search-Based Approach for Test Suite Generation from Extended Finite State Machines," 2016 International Conference on Progress In Informatics and Computing (PIC), Dec. 23, 2016, 6 pages, IEEE.

Teman, A., "Design for Test (DFT)," EnICS Labs, Bar-Ilan University, Emerging Nanoscaled Integrated Circuits and Systems Labs, Jun. 24, 2020, 56 pages.

* cited by examiner

500

600

602 — SET SHIFT ENABLE SIGNAL TO LOW FOR TWO OR MORE CONSECUTIVE CLOCK SIGNALS

604 — SET TEST INPUT SIGNAL BASED ON SCAN CHAIN UNDER TEST

606 — CONFIGURE DISPATCHER OUTPUT INTERFACE USING TEST INPUT SIGNAL

608 — CONFIGURE DISPATCHER INPUT INTERFACE USING TEST INPUT SIGNAL

610 — EXIT DISPATCHER INTERFACE CONFIGURATION MODE

612 — TEST SELECTED SCAN CHAIN

ARCHITECTURE FOR TESTING MULTIPLE SCAN CHAINS

TECHNICAL FIELD

The present disclosure generally relates to design for testing (DFT) and, in particular embodiments, to an architecture for testing multiple scan chains.

BACKGROUND

Integrated circuits (ICs) are generally tested for faults. In particular, the logic circuits of the integrated circuit are commonly tested using a method often referred to as scan testing. During scan testing, test patterns are shifted in through one or more chains of flip-flops (i.e., scan chains) to stimulate one or more logic circuits. Results from the stimulated logic circuits are loaded into the scan chains and are shifted out for evaluation. When the shifted-out patterns match expected patterns (based on the proper functioning of one or more logic circuits), no faults are detected, and the circuit may be defect-free. Faults are detected when the shifted-out patterns do not match the expected patterns.

An Asynchronous Finite State Machine (AFSM) Intellectual Property (IP) is a type of digital logic system. It's used in complex mechanisms like computer operations, digital circuits, engineering applications, and the like. Unlike its synchronous counterpart, which relies on clock signals to transition from one state to another, an AFSM makes these transitions independently, responding immediately to input changes.

AFSM-based IP generally has a design consisting of several finite states. These states define its behavior in response to a sequence of input signals. For each given state, there's a corresponding next state specified by transition rules, forming a state-transition diagram that models the AFSM's operation.

The advantage of AFSM in IP design is its ability to execute transitions faster because it is not limited by a clock cycle. This often leads to higher performance and lower power consumption designs since there aren't unnecessary transitions when the inputs don't change.

Adding multiple scan chains during the design for testing phase is used to help verify the functionality of multiple AFSM-based IPs. These multiple scan chains cover the overall aspect of the IP, resulting in reducing the IP's test time compared to single scan chain architectures. However, the trade-off often comes with a larger pin overhead requirement pointing to the complexity in managing the number of physical links or connections to the IP. An improvement to the conventional testing of AFSM IP is, thus, desirable.

SUMMARY

Technical advantages are generally achieved by embodiments of this disclosure, which describe an architecture for testing multiple scan chains.

A first aspect relates to a test system for serially testing N number of finite state machine circuits using N number of scan chains, where N is an integer greater than one. Each scan chain is coupled to a finite state machine circuit to test the finite state machine circuit coupled thereto. Each scan chain has M number of input terminals and one output terminal, where M is an integer greater than one. The test system includes a dispatcher input interface having M number of input terminals and N sets of output terminals, where each of the N set of output terminals includes M number of output terminals coupled to the M number of input terminals of an associated scan chain. The test system further includes a dispatcher output interface with N number of input terminals and one output terminal. The output terminal of each scan chain is coupled to one of the N number of input terminals of the dispatcher output interface.

A second aspect relates to a method for serially testing N number of finite state machine circuits using N number of scan chains, where N is an integer greater than one, each scan chain coupled to a finite state machine circuit to test the finite state machine circuit coupled thereto. Each scan chain has M number of input terminals and one output terminal, where M is an integer greater than one. The method includes receiving two or more consecutive logic level low shift enable signals or reset signals to initiate a configuration of a dispatcher input interface. The dispatcher input interface has M number of input terminals and N sets of output terminals. E of the N set of output terminals having M number of output terminals coupled to the M number of input terminals of an associated scan chain. The method further includes receiving a test input signal indicating the scan chain to be selected for testing the finite state machine circuit coupled to the scan chain; and receiving one or more logic level high shift enable signals or reset signals to end the configuration of the dispatcher input interface.

A third aspect relates to a device. The device includes N number of asynchronous finite state machine circuits, where N is an integer greater than one; and N number of scan chains, each scan chain coupled to an asynchronous finite state machine circuit to test the asynchronous finite state machine circuit coupled thereto. Each scan chain has M number of input terminals and one output terminal, where M is an integer greater than one. The device includes a dispatcher input interface with M number of input terminals and N sets of output terminals. Each of the N set of output terminals has M number of output terminals coupled to the M number of input terminals of an associated scan chain. The device further includes a dispatcher output interface having N number of input terminals and one output terminal. The output terminal of each scan chain is coupled to one of the N number of input terminals of the dispatcher output interface.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of an Asynchronous Finite State Machine (AFSM)-based Intellectual Properties (IPs), it should also be appreciated that these inventive aspects may also apply to Synchronous Finite State Machine (AFSM)-based IP. In particular, aspects of this disclosure may apply to DC-DC Active-Matrix Organic Light-Emitting Diodes (AMOLED) display drivers, Power Management Integrated Circuit (PMIC), rectifier-type applications, and the like.

In embodiments, a test structure is proposed capable of testing multiple AFSMs-based IPs using several scan chains in sequence with a standard pinout interface. The proposed test structure advantageously improves test duration compared to the single scan chain architecture. Further, aspects of this disclosure advantageously retain the same number of pins as the single chain architecture in contrast to the conventional parallel testing of multiple scan chains. The proposed test structure is advantageously compliant with standard Automatic Test Pattern Generator (ATPG) tools, which can be accomplished by setting a register of a dispatch interface by the ATPG tool to drive scan signals for the scan chain under test. These and other details are further detailed below.

Figure 1:
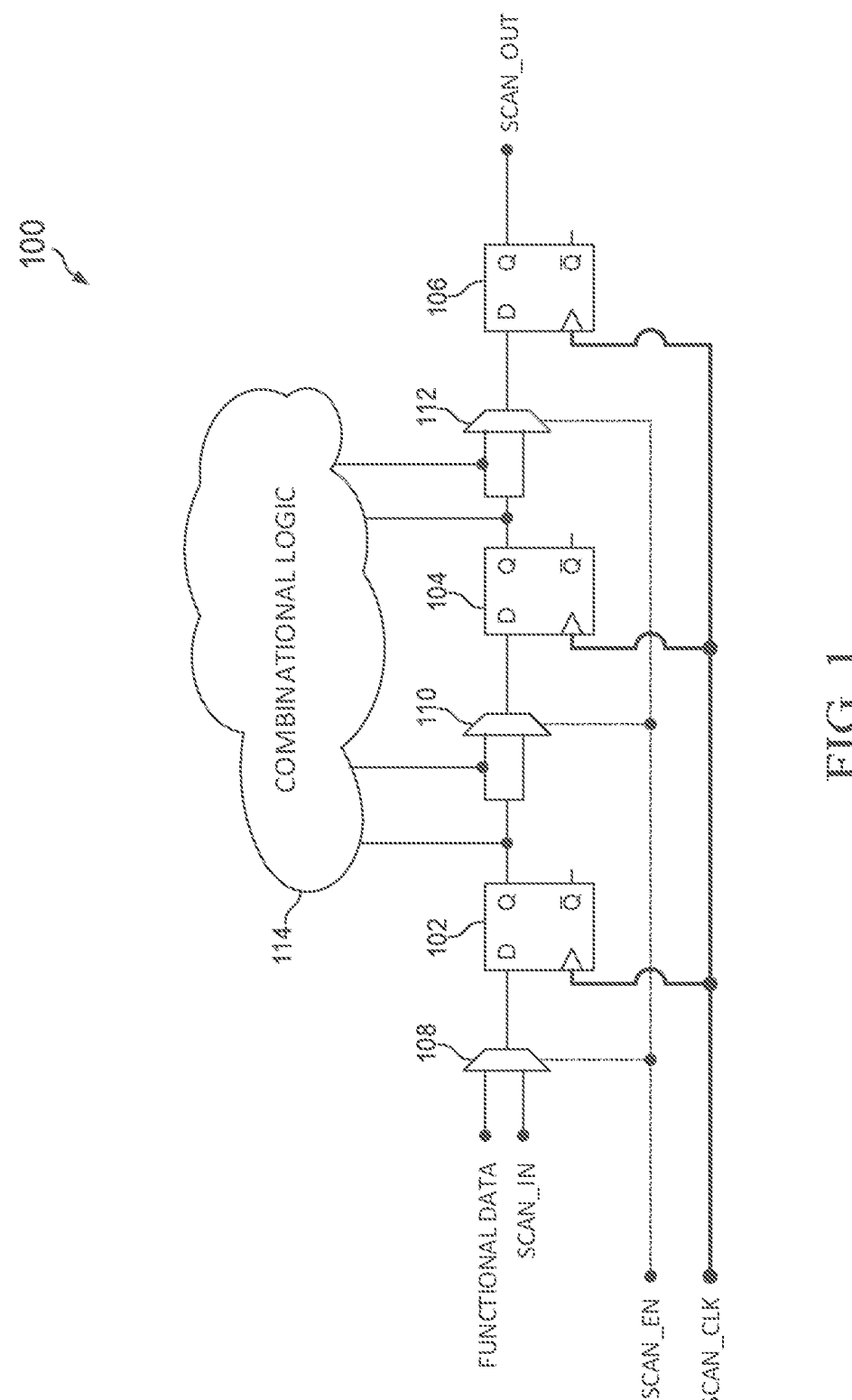
FIG. 1 is a block diagram of an architecture for testing a scan chain.

FIG. 1 illustrates a block diagram of an architecture for testing a scan chain 100 in, for example, a digital circuit. Scan chain 100 includes a first scan flip-flop 102, a second scan flip-flop 104, a third scan flip-flop 106, a first multiplexer 108, a second multiplexer 110, a third multiplexer 112, and a combinational logic 114, which may (or may not) be arranged as shown. Scan flip-flop 100 may include additional components not shown, such as additional scan-flip flops and an associated multiplexer for each.

The first scan flip-flop 102, the second scan flip-flop 104, and the third scan flip-flop 106 are arranged in the scan chain 100 to test one or more logic components of the combinational logic 114 in the digital circuit using, for example, ATPG techniques.

The data input (D) of the first scan flip-flop 102 is coupled to the output of the first multiplexer 108, the data input (D) of the second scan flip-flop 104 is coupled to the output of the second multiplexer 110, and the data input (D) of the third scan flip-flop 106 is coupled to the output of the third multiplexer 112. The output of the first scan flip-flop 102 and the second scan flip-flop 104 is coupled to the combinational logic 114.

Each multiplexer 108, 110, and 112 includes a functional input terminal, a test input terminal, a selection terminal, and an output terminal. The functional input terminal to the second multiplexer 110 and the third multiplexer 112 is coupled to the combinational logic 114.

The value at the selection terminal of each multiplexer 108, 110, and 112 through the scan enable signal (SCAN_EN) determines whether one of the functional signal or the test input signal (SCAN_IN) is selected at its output. The output signal (SCAN_OUT) of the third scan flip-flop 106 provides the result of the test pattern for the digital circuit during test mode.

A clock signal (SCAN_CLK) is coupled to the clock input of each of the first scan flip-flop 102, the second scan flip-flop 104, and the third scan flip-flop 106. The clock signal controls the operations' timing and synchronizes the data's movement through the scan chain 100. In test mode, the scan chain 100 uses the clock signal to serially shift test data into and out of the scan flip-flops. When the clock signal is applied, the test data moves from one scan flip-flop to the next. In functional mode, the clock signal is used to control the regular operation of the digital circuit, ensuring that data moves through the circuit and scan flip-flops in proper synchronization.

The transition from functional mode to test mode and vice versa is achieved by altering the input at the selection terminal of the respective multiplexer through the scan enable signal (SCAN_EN). This provides an efficient mechanism for testing the combinational logic 114 within the digital circuit during normal operation and when undergoing fault detection and diagnosis. The workflow between functional and test modes differs, determined by the logic level of the scan enable signal at the selection terminal of each multiplexer 108, 110, and 112. During functional mode (i.e., when the scan enable signal is de-asserted), multiplexers 108, 110, and 112 select the functional inputs. This allows the digital circuit to operate normally by passing input signals through combinational logic 114 and the scan chain 100. The first scan flip-flop 102, the second scan flip-flop 104, and the third scan flip-flop 106 bring out the functional outputs of the combinational logic 114.

During test mode (i.e., when the scan enable signal is asserted), multiplexers 108, 110, and 112 select the test inputs. A predefined test pattern is fed to the scan chain 100 as the test input signal (SCAN_IN). After the test pattern has been fully shifted into the scan chain, the clock signal subsequently shifts out the result of the test pattern as the output signal (SCAN_OUT). The outputs of the scan flip-flops 102, 104, and 106, triggered by the clock signal, provide the test data that reflects the status of the combinational logic 114 under test.

During test mode, scan chain testing is typically conducted in two phases: scan-in and scan-out. A test pattern is provided to the scan chain during the scan-in phase. The test pattern traverses the scan chain 100, with the third scan flip-flop 106 capturing and storing the output of the scan chain 100. During the scan-out phase, the output signal (SCAN_OUT) is compared to expected values to identify discrepancies, indicating faults or errors in the scan chain 100. Single scan chain architectures similar to scan chain 100 are straightforward and simple to deploy but tend to be slow and inefficient when testing larger, more complex designs.

Current ATPG tools lack support for AFSM-based IPs, primarily consisting of latch-based blocks with combinatorial loops. To address this, custom scan test architectures have been developed. The growing complexity of AFSM-based IPs has increased the number of AFSMs within a single IP, complicating the testing process. Existing single scan chain architectures, such as that shown in FIG. 1, are less efficient for these complex designs because they require loading a lengthy chain of inputs for every AFSM in the design for each test pattern. Although all AFSMs could be tested simultaneously, the number of patterns needed would equal that required for the largest AFSM, making the approach inefficient.

Figure 2:
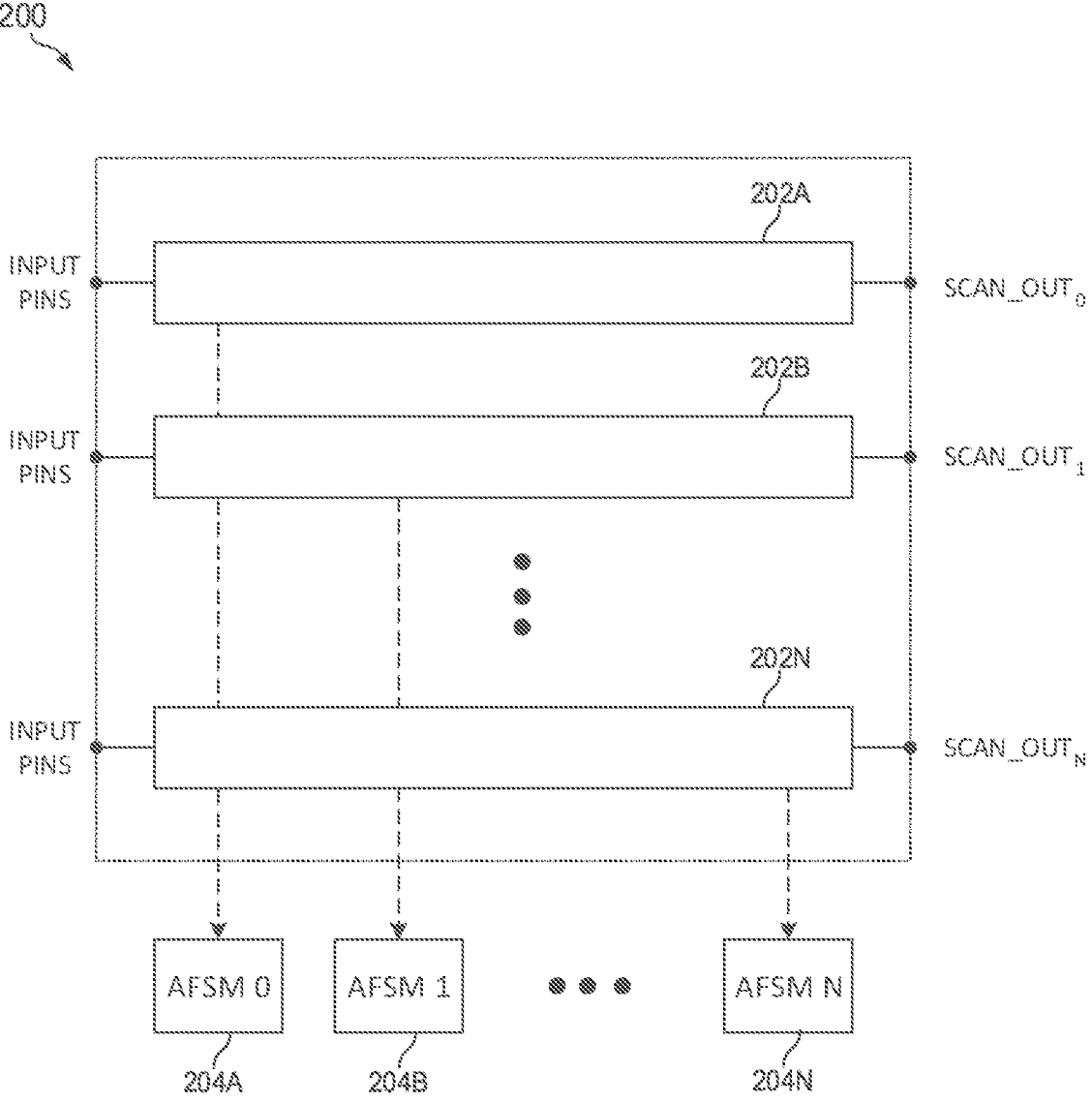
FIG. 2 is a block diagram of an architecture for testing multiple AFSMs in parallel.

FIG. 2 illustrates a block diagram of an architecture for testing multiple AFSMs 204A-N in parallel in, for example, a digital circuit. Each scan chain 202A-N can be represented as scan chain 100. Each scan chain 202A-N is coupled to a corresponding AFSM 204A-N. For example, the first scan chain 202A is coupled to the first AFSM 204A, the second scan chain 202B is coupled to the second AFSM 204B, and the last scan chain 202N is coupled to the last AFSM 204N.

Each scan chain 202A-N output signal (SCAN_OUT$_i$) provides a test output for the corresponding AFSM 204A-N, where i is an integer from 0 to N. The output signal (SCAN_OUT$_i$) is compared to expected values to identify discrepancies, indicating faults or errors in the AFSM 204A-N. Using multiple scan chains 202A-N for testing multiple AFSM IPs is advantageous in minimizing test time compared to a single, long scan chain architecture, such as that in FIG. 1.

The multiple scan chain architecture, as shown in FIG. 2, enables parallel testing, which quickens the overall testing process but comes with the drawback of requiring a higher pin count, which can be an issue for pin-limited Analog On Top designs, as each scan chain 202A-N requires multiple input pins and an output pin.

Figure 3:
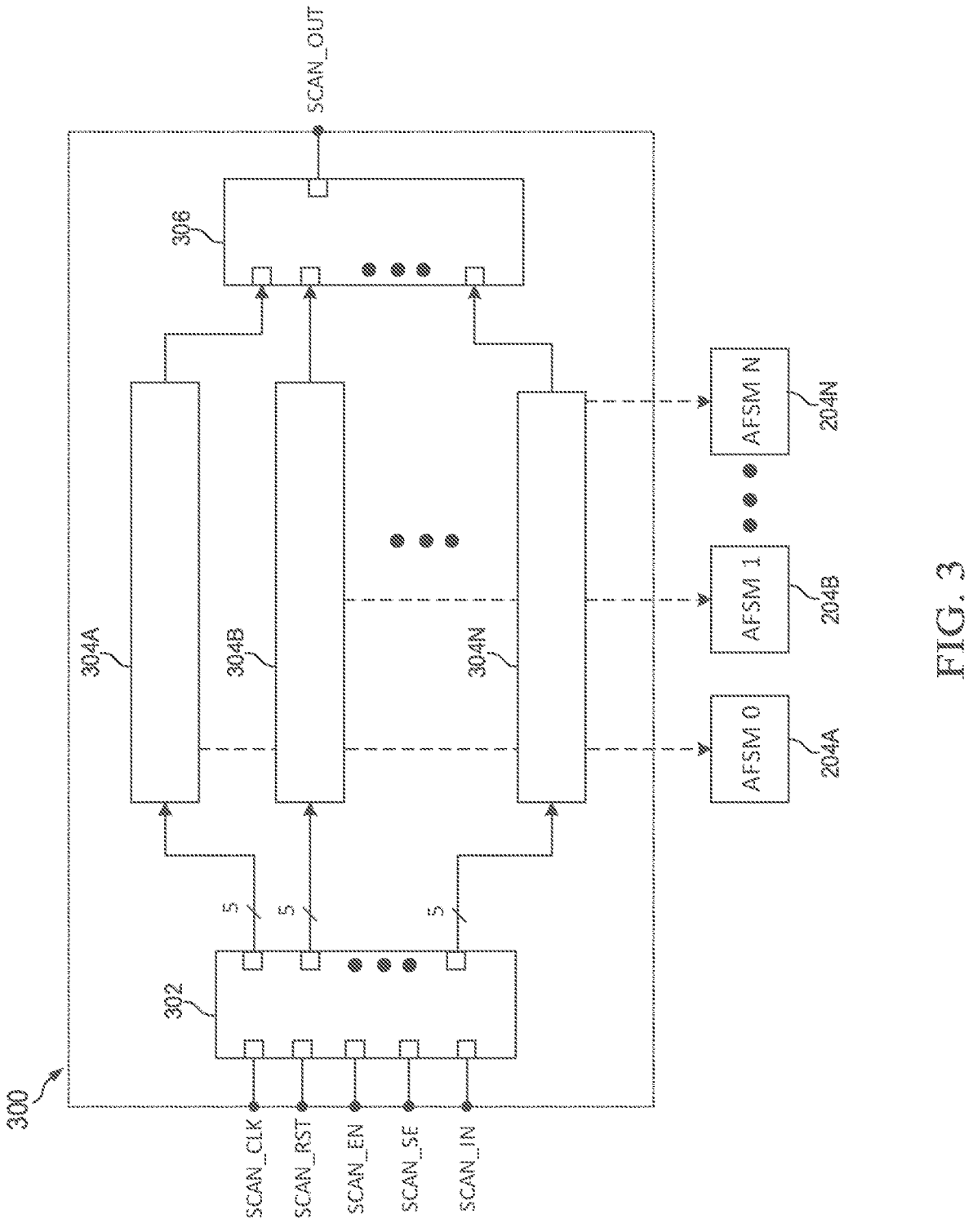
FIG. 3 is a block diagram of an embodiment test system for testing a digital circuit.

FIG. 3 illustrates a block diagram of an embodiment test system 300 for testing a digital circuit. Test system 300 allows for testing multiple AFSM-based IPs through multiple scan chains without adding to the pinout of the digital circuit. This addresses the inefficiencies tied to single scan chain architectures, particularly in testing increasingly complex AFSM-based IPs.

Test system 300 includes a dispatcher input interface 302, scan chains 304A-N, a dispatcher output interface 306, and AFSMs 204A-N, which may (or may not) be arranged as shown. Test system 300 may include additional components not shown. In embodiments, dispatcher input interface 302 and dispatcher output interface 306 form a single dispatcher interface.

Dispatcher input interface 302 provides a single input interface with minimal test pins coupled to the test tool. The dispatcher input interface 302 provides a single conduit to test multiple scan chains in a serial fashion. In embodiments, dispatcher input interface 302 has five input terminals. In embodiments, the first input terminal receives the clock signal (SCAN_CLK). The clock signal synchronizes the operation of the scan flip-flops in the scan chains 304A-N.

In embodiments, the second input terminal of the dispatcher input interface 302 receives a reset signal (SCAN_RST). The reset signal is used to reset the AFSMs 204A-N coupled to scan chains 304A-N.

In embodiments, the third input terminal of the dispatcher input interface 302 receives the scan enable signal (SCAN_EN). The scan enable signal is used to operate the IP in test mode.

In embodiments, the fourth input terminal of the dispatcher input interface 302 receives a shift enable signal (SCAN_SE). The shift enable signal enables shifting of a shift register used to control the various inputs of each scan chain 304A-N and capture outputs of the associated scan chain 304A-N.

In embodiments, the fifth input terminal of the dispatcher input interface 302 is configured to receive the test input signal (SCAN_IN). The test input signal corresponds to the scan test patterns that are shifted in through the scan chains 304A-N for the testing of the AFSMs 204A-N.

Dispatcher input interface 302 includes multiple sets of output pins. In embodiments, each set of output pins includes five output pins, coupled to the five input pins of an associated scan chain 304A-N. For example, in the test system 300, which has N number of scan chains 304A-N, the total number of output pins of the dispatcher input interface 302 is 5×N. The first set of output pins of the dispatcher input interface 302 is coupled to the inputs of the first scan chain 304A, the second set of output pins of the dispatcher input interface 302 is coupled to the inputs of the second chain 304B, and so forth.

Dispatcher output interface 306 provides a single output interface with minimal test pins coupled to the test tool. The dispatcher output interface 306 provides a single conduit to test multiple scan chains in a serial fashion.

Dispatcher output interface 306 includes multiple inputs. In embodiments, each input of the dispatcher output interface 306 is coupled to an output of an associated scan chain 304A-N. For example, in the test system 300, which has N number of scan chains 304A-N, the total number of input pins of the dispatcher output interface 306 is N. Dispatcher output interface 306 includes a single output pin. The output pin is configured to output the test output signal (SCAN_OUT). The test output signal corresponds to the output results from the test input signal, which are shifted out for evaluation.

Each scan chain 304A-N has five input pins and one output pin. In embodiments, the first input pin of the scan chain is configured to receive the clock signal (SCAN_CLK$_i$) from the dispatcher input interface 302, where i is an integer from 0 to N. The clock signal synchronizes the operation of the scan flip-flops in the scan chain 304A-N.

In embodiments, the second input pin of each scan chain 304A-N is configured to receive the reset signal (SCAN_RSTN$_i$) from the dispatcher input interface 302. The reset signal resets the ASFMs coupled to the scan chain 304A-N.

In embodiments, the third input pin of each scan chain 304A-N is configured to receive the scan enable signal (SCAN_EN$_i$) from the dispatcher input interface 302. The scan enable signal enables the test scan operation of the scan chain 304A-N.

In embodiments, the fourth input pin of each scan chain 304A-N is configured to receive a shift enable signal (SCAN_SE$_i$) from the dispatcher input interface 302. The shift enable signal enables shifting of a shift register used to control the various inputs of each scan chain 304A-N and capture outputs of the associated scan chain 304A-N.

In embodiments, the fifth input pin of each scan chain 304A-N is configured to receive the test input signal (SCAN_IN$_i$) from the dispatcher input interface 302. The test input signal corresponds to the scan test pattern shifted through the scan chain 304A-N for testing the associated AFSM 204A-N.

In embodiments, the output pin of each scan chain 304A-N is coupled to an input pin of the dispatcher output interface 306. The output pin of each scan chain 304A-N outputs the results of the test patterns shifted through the scan chain 304A-N to the dispatcher output interface 306.

In embodiments, test time reduction is achieved by serially testing each small scan chain 304A-N instead of loading a single, lengthy scan chain for each test pattern shift insertion. Test system 300 enables testing of multiple AFSM-based IPs using various scan chains 304A-N, with a standard pinout interface coupled to the dispatcher input interface 302 and the dispatcher output interface 306, streamlining the testing process.

The dispatcher input interface 302 directs the test input signals to one of the many available scan chains 304A-N. In embodiments, the configuration of the dispatcher input interface 302 is by a specific register configuration. In embodiments, the configuration of the dispatcher input interface 302 is set via an accessible test pin.

In embodiments, two or more consecutive captures initiate the dispatcher input interface 302 configuration. Once these two captures are completed, the test input signal is used to configure the dispatcher input interface 302. The dispatcher input interface 302 allows the selection of any of the scan chains 304A-N in the IP. In embodiments, a shift is used to exit from the dispatcher input interface 302 configuration setting. Once the scan chain is selected, the scan signals are driven exclusively to the chosen scan chain. In embodiments, two or more consecutive captures are used to reconfigure the dispatcher input interface 302 and test another scan chain.

The disclosed test scan architecture allows testing a single AFSM at a time. In embodiments, the same process to enable the configuration of the dispatcher input interface 302 and selection of the scan chain configures the dispatcher output interface 306, such that the corresponding output signal is provided at the output of the dispatcher output interface 306 from the scan chain under test.

Figure 4:
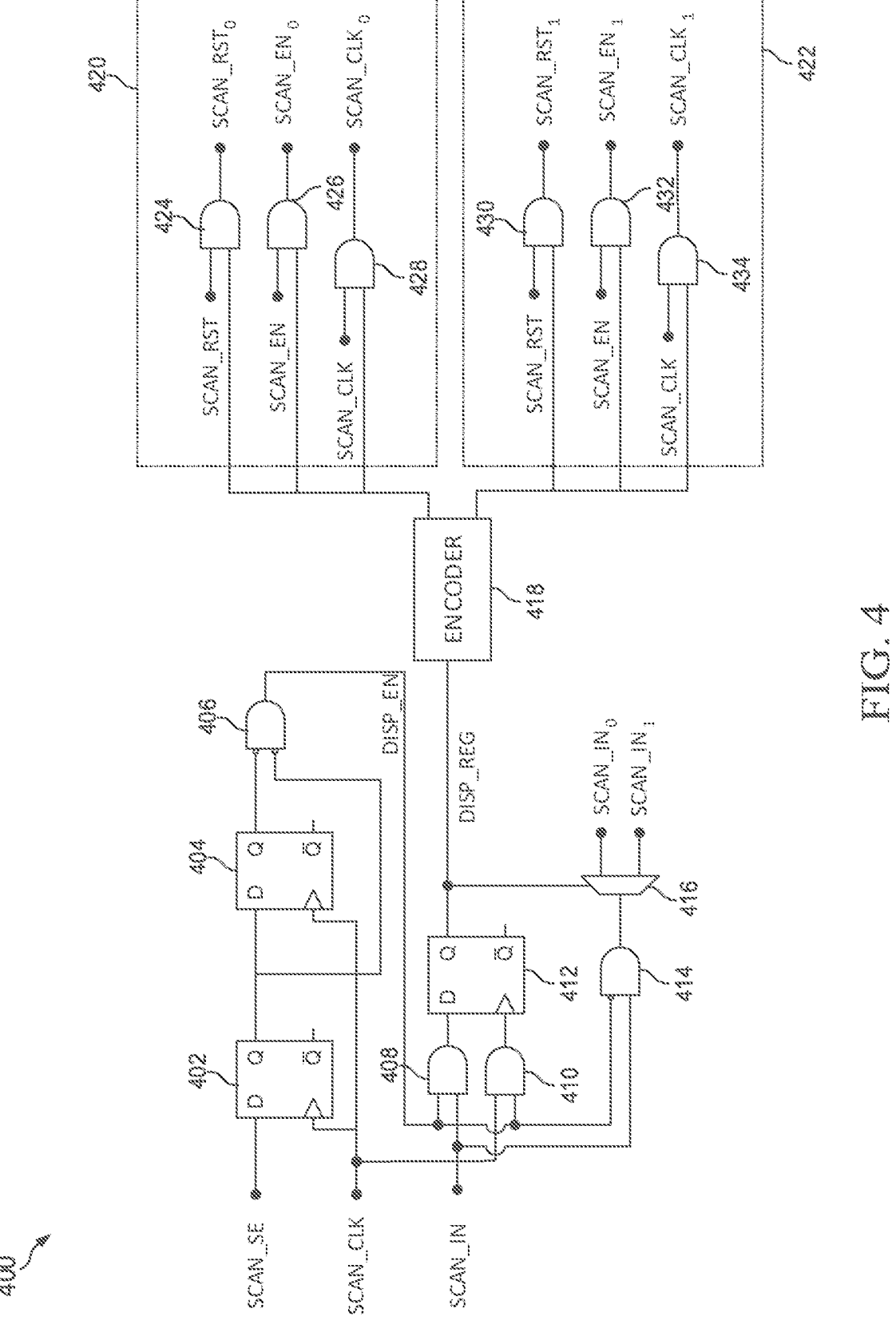
FIG. 4 is a schematic of an embodiment dispatcher input interface.

FIG. 4 illustrates a schematic of an embodiment dispatcher input interface 400, which may be implemented as the dispatcher input interface 302 of FIG. 3. Dispatcher input interface 400 includes a first flip-flop 402, a second flip-flop 404, a first AND gate 406, a second AND gate 408, a third AND gate 410, a third flip-flop 412, a fourth AND gate 414, a demultiplexer 416, an encoder circuit 418, a first set of logic gates 420, and a second set of logic gates 422, which may (or may not) be arranged as shown. The first AND gate 406 is a two-input AND gate with inverted input terminals. The fourth AND gate 414 is a two-input AND gate with a single inverted input terminal.

The first set of logic gates 420 includes a fifth AND gate 424, a sixth AND gate 426, and a seventh AND gate 428, which may (or may not) be arranged as shown. The second set of logic gates 422 includes an eighth AND gate 430, a ninth AND gate 432, and a tenth AND gate 434, which may (or may not) be arranged as shown.

As shown, the dispatcher input interface 400 is configured for two scan chains (i.e., it has two sets of logic gates 420 and 422, one for each scan chain). It should be appreciated that the number of scan chains coupled to the dispatcher input interface 400 is non-limiting, and more scan chains than two are contemplated in embodiments. In such embodiments, for each additional scan chain, an additional set of logic gates with three AND gates are added to the dispatcher input interface 400. In addition, dispatcher input interface 400 would require additional flip-flops in place of the third flip-flop 412. For example, in the case of four scan chains, an additional flip-flop is added to the dispatcher input interface 400.

The data input (D) of the first flip-flop 402 is configured to receive the shift enable signal (SCAN_SE). The output (Q) of the first flip-flop 402 is coupled to the data input (D) of the second flip-flop 404 and a first inverted input of the first AND gate 406. The output (Q) of the second flip-flop 404 is coupled to a second inverted input of the first AND gate 406. The output of the first AND gate 406 provides a dispatch enable signal (DISP_EN).

The output of the first AND gate is coupled to a first input of the second AND gate 408, a first input of the third AND gate 410, and an inverted input of the fourth AND gate 414, which receives the dispatch enable signal.

The second input of the second AND gate 408 and the second non-inverting input of the third AND gate 410 are configured to receive the test input signal (SCAN_IN).

The clock signal (SCAN_CLK) is provided to the clock input of the first flip-flop 402, the second flip-flop 404, the second input of the third AND gate 410, the first input of the seventh AND gate 428, and the first input of the tenth AND gate 434.

The output of the second AND gate 408 is coupled to the data input (D) of the third flip-flop 412. The output of the third AND gate 410 is coupled to the clock input of the third flip-flop 412. The output of the fourth AND gate 414 is coupled to the input of the demultiplexer 416.

The output of the third flip-flop 412 is coupled to the selection terminal of the demultiplexer 416 and an input of the encoder circuit 418. The output of the third flip-flop 412 provides a dispatch register signal (DISP_REG).

Based on the value of the dispatch register signal (DISP_REG), the demultiplexer 416 forwards the signal at the output of the fourth AND gate 414 as a test input signal (i.e., $SCAN\_IN_0$ or $SCAN\_IN_1$) to the scan chain 304A-N under test.

In embodiments, when the dispatch register signal (DISP_REG) is at a logic level low (i.e., '0'), the demultiplexer 416 forwards the first test input signal ($SCAN\_IN_0$) for the first scan chain while providing a logic level low signal to the second scan chain.

In embodiments, when the dispatch register signal (DISP_REG) is at a logic level high (i.e., '1'), the demultiplexer 416 forwards the second test input signal ($SCAN\_IN_1$) for the second scan chain while providing a logic level low signal to the first scan chain.

In embodiments, the demultiplexer 416 is a one-hot encoder circuit (not shown), similar to the demultiplexer 416.

The reset signal (SCAN_RST) is provided to the first input of the fifth AND gate 424 and the first input of the eighth AND gate 430.

The scan enable signal (SCAN_EN) is provided to the first input of the sixth AND gate 426 and the first input of the ninth AND gate 432.

In embodiments, for a two scan chain configuration, encoder circuit 418 is configured to receive either a logic level low signal or a logic level high signal.

In embodiments, when the dispatch register signal (DISP_REG) is at a logic level low, the encoder circuit 418 provides a logic level high signal to the second input of the fifth AND gate 424, the second input of the sixth AND gate 426, and the second input of the seventh AND gate 428, while providing a logic level low signal to the second input of the eight AND gate 430, the second input of the ninth AND gate 432, and the second input of the tenth AND gate 434.

In embodiments, when the dispatch register signal (DISP_REG) is at a logic level high, the encoder circuit 418 provides a logic level low signal to the second input of the fifth AND gate 424, the second input of the sixth AND gate 426, and the second input of the seventh AND gate 428, while providing a logic level high signal to the second input of the eight AND gate 430, the second input of the ninth AND gate 432, and the second input of the tenth AND gate 434.

In embodiments, the encoder circuit 418 is a one-hot encoder circuit (as shown). In embodiments, the encoder circuit 418 is arranged as a demultiplexer (not shown), similar to the demultiplexer 416.

It should be appreciated that in embodiments where the number of scan chains exceeds two, the encoder circuit receives additional input signals from additional flip-flops (instead of only the third flip-flop 412) and, based thereon, selectively enables one of the scan chains while disabling the others.

Figure 5:
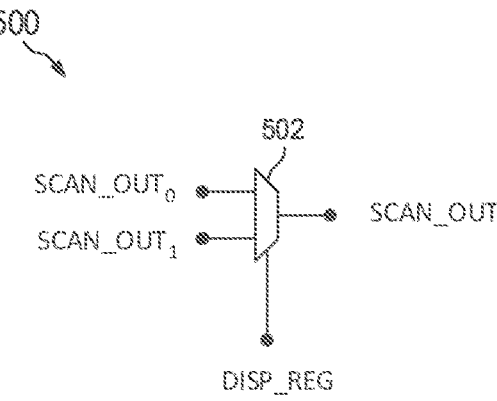
FIG. 5 is a schematic of an embodiment dispatcher output interface.

FIG. 5 illustrates a schematic of an embodiment dispatcher output interface 500, which may be implemented as the dispatcher output interface 306 of FIG. 3. Dispatcher output interface 500 includes a multiplexer 502.

The multiplexer 502 has a first input terminal coupled to the output terminal of the first scan chain 304A. The multiplexer has a second input terminal coupled to the output terminal of the second scan chain 304B. In embodiments where the number of scan chains exceeds two, multiplexer 502 has additional inputs coupled to a respective output of the additional scan chains.

Multiplexer 502 has a selection terminal coupled to the dispatch register signal (DISP_REG), provided by the output of the third flip-flop 412 of the dispatcher input interface 400. Based on the value of the dispatch register signal, multiplexer 502 passes through an output of one of the scan chains 304A-N to the output of the multiplexer 502 as the output signal (SCAN_OUT).

The configuration of the dispatcher input interface 400 is triggered by two or more consecutive captures. After the two consecutive captures are completed, the test input signal is used to configure the dispatcher input interface 400 sequentially. Configuring the dispatcher input interface 400 leads to selecting one of the scan chains. A shift, as opposed to a capture, is used to exit from the dispatcher configuration mode. This allows the test operation to be carried out smoothly, indicating the completion of the dispatcher configuration process. Once the dispatcher input interface 400 is configured, the test input signals will be directed toward the scan chain previously selected during the configuration process. Two consecutive captures are applied again to reconfigure the dispatcher input interface 400 and test another scan chain. This repetition allows the test system 300 to shift the configuration and work with other scan chains.

Figure 7:
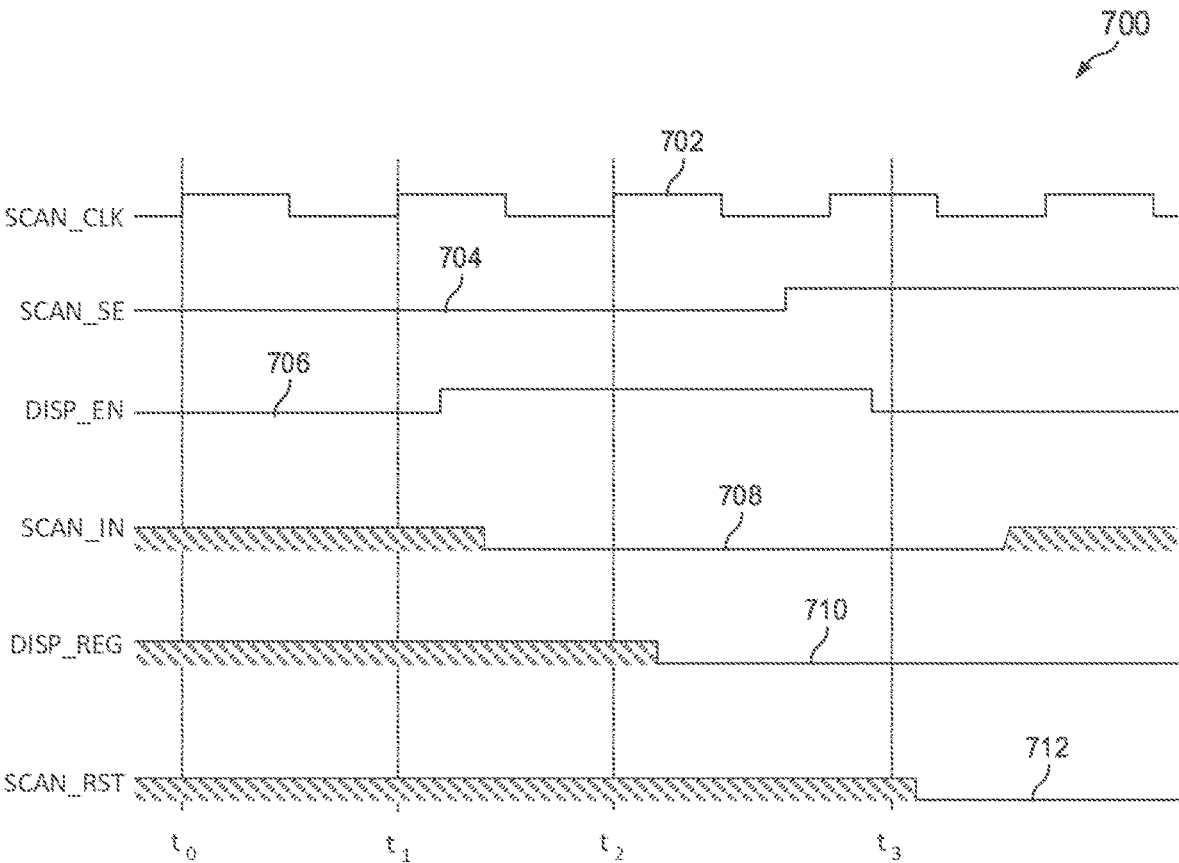
FIG. 7 is a timing diagram of embodiment signals used to operate a scan chain.
Figure 6:
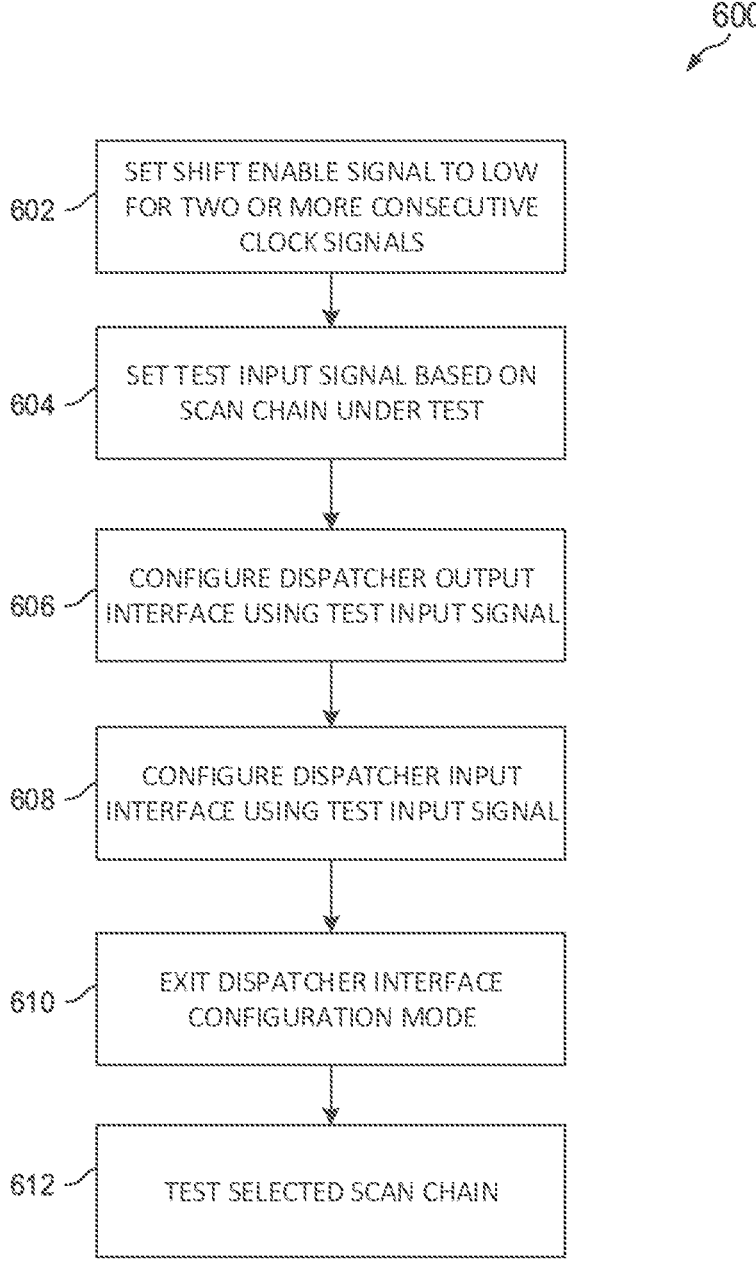
FIG. 6 is a flow chart of an embodiment method to operate the test system.

The operation of the test system 300 based on the dispatcher input interface 400 and the dispatcher output interface 500 is described in further detail with respect to FIGS. 6 and 7.

FIG. 6 illustrates a flow chart of an embodiment method to operate the test system 300. FIG. 7 illustrates a timing diagram of embodiment signals used to operate a scan chain of the test system 300.

As disclosed herein above, the dispatcher input interface 400 and the dispatcher output interface 500 provide a common interface for testing multiple scan chains 304A-N in a serial fashion. The common interface allows the multiple scan chains to be tested using the minimum input and output pins. The structure and the functional operation of the dispatcher input interface 400 and the dispatcher output interface 500 allow selective testing of individual short scan chains coupled to an AFSM. Each short scan chain is coupled to a set of output pins of the dispatcher input interface 400 and an input pin of the dispatcher output interface 500.

Thus, the dispatcher input interface 400 selectively drives the scan signals to one of the multiple short scan chains coupled to an AFSM under test. The selective driving of the scan signals is based on a configuration of the dispatcher input interface 400 corresponding to the scan signals received at its input.

At step 602, at time $t_0$, to initiate the configuration of the dispatcher input interface 400 and the dispatcher output interface 500, the shift enable signal (SCAN_SE) 704, received at the data input (D) of the first flip-flop 402, is set to a logic level low (i.e., '0') for two or more consecutive clock signals (SCAN_CLK) 702—corresponding to two consecutive captures.

As a result, the output (Q) of the first flip-flop 402 and the output (Q) of the second flip-flop 404 are at a logic level low. Accordingly, the inverting inputs of the first AND gate 406 are at a logic level low, resulting in the dispatch enable signal (DISP_EN) 706, at the output of the first AND gate 406, transitioning from a logic level low to a logic level high (i.e., '1').

In embodiments where more than two consecutive clock signals 702 are used to initiate the configuration of the dispatcher input interface 400 and the dispatcher output interface 500, additional flip-flops are added to the first flip-flop 402 and second flip-flop 404.

In embodiments, not shown, the reset signal (SCAN_RST) 712 is used instead of the shift enable signal 704. In such embodiments, the data input (D) of the first flip-flop 402 receives the reset signal 712 instead of the shift enable signal 704. Like the above, the reset signal 712 is set to a low logic level for two or more consecutive clock signals 702 to initiate the configuration.

It should be noted that the usage of the reset signal 712 or the shift enable signal 704 is non-limiting, and other signals can be similarly used in other embodiments. The reset signal 712 or the shift enable signal 704 allows a non-standard usage (i.e., setting the signal at a logic level low for two consecutive clock signals 702) through a standard pin.

At step 604, at time $t_2$, after two consecutive clock signals 702, the test input signal (SCAN_IN) 708 drives the data input (D) of the third flip-flop 412 through the second AND gate 408. In particular, in response to the test input signal 708 being at a logic level low at the second input of the second AND gate 408, the output of the second AND gate 408 is at a logic level low, which results in the dispatch register signal (DISP_REG) 710 being at a logic level low.

To test the second scan chain, in response to the test input signal 708 being at a logic level high at the second input of the second AND gate 408, the output of the second AND gate 408 is at a logic level high, which results in the dispatch register signal (DISP_REG) 710 being at a logic level high.

At step 606, at time $t_3$, in response to the dispatch register signal 710 being at a logic level low, the demultiplexer 416 selects the first input signal (SCAN_IN$_0$) for the first scan chain. And, in response to the dispatch register signal 710 being at a logic level high, the demultiplexer 416 selects the second input signal (SCAN_IN$_1$) for the second scan chain.

At step 608, at time $t_3$, in response to the dispatch register signal 710 being at a logic level low, the encoder circuit 418 provides a logic level high signal to the second input of the fifth AND gate 424, the second input of the sixth AND gate 426, and the second input of the seventh AND gate 428, while providing a logic level low signal to the second input of the eight AND gate 430, the second input of the ninth AND gate 432, and the second input of the tenth AND gate 434.

In response to the dispatch register signal 710 being at a logic level high, the encoder circuit 418 provides a logic level low signal to the second input of the fifth AND gate

424, the second input of the sixth AND gate 426, and the second input of the seventh AND gate 428, while providing a logic level high signal to the second input of the eight AND gate 430, the second input of the ninth AND gate 432, and the second input of the tenth AND gate 434.

Similarly, in response to the dispatch register signal 710 being at a logic level low, the multiplexer 502 of the dispatcher output interface 500 forwards the output signal (SCAN_OUT$_0$) of the first scan chain as the output signal (SCAN_OUT) of the dispatcher output interface 500. In response to the dispatch register signal 710 being at a logic level high, the multiplexer 502 forwards the output signal (SCAN_OUT$_1$) of the second scan chain as the output signal (SCAN_OUT) of the dispatcher output interface 500.

The output signal (SCAN_OUT) of the dispatcher output interface 500 is then shifted out for evaluation and compared to the expected results. No faults are detected when the shifted-out patterns match expected patterns, and the AFSM is considered defect-free. Faults are detected when the shifted-out patterns do not match the expected patterns.

Thus, at time $t_3$, at step 608, the dispatcher input interface 400 is configured to test one of the two scan chains. It should be noted that for embodiment test systems with greater than two scan chains, similar operations can be contemplated.

Once the dispatcher input interface 400 is configured to test a particular scan chain, at step 610, between time $t_2$ and time $t_3$, to exit the configuration of the dispatcher input interface 400, the shift enable signal 704, received at the data input (D) of the first flip-flop 402, is set to a logic level high for one or more clock signals—corresponding to a shift operation. As a result, the output (Q) of the first flip-flop 402 is at a logic level low; accordingly, an inverting input of the first AND gate 406 is at a logic level high, resulting in the dispatch enable signal (DISP_EN) 706 at the output of the first AND gate 406 transitioning from a logic level high to a logic level low.

At step 612, as the inverting input of the fourth AND gate 414 is at a logic level low, the output of the fourth AND gate 414 provides the test input signal 708 to the selected scan chain, which allows for the testing of the AFSM tied to the corresponding scan chain.

To test another scan chain, the shift enable signal (SCAN_SE) 704, received at the data input (D) of the first flip-flop 402, is set to a logic level low for two consecutive clock signals 702 (SCAN_CLK)—corresponding to two consecutive captures and the test input signal 708 is used to configure the dispatcher input interface 400 and the dispatcher output interface 500.

Advantageously, test time reduction is achieved by serially testing each small scan chain, as proposed, rather than loading a single long scan chain in a single scan chain architecture for every test pattern shift insertion. In the single scan chain architecture, for each test pattern, the entire chain of all joined AFSM inputs is loaded, and the total count of test patterns is equal to the number of patterns in the largest AFSM in the IP, as all AFSMs are tested in parallel by the single long scan chain. In contrast, in embodiments of the present disclosure, with a single-input, multi-scan chain architecture, the AFSMs are tested serially. However, in this case, the length and the count of the test patterns depend on the size of the AFSM being tested.

For example, in an IP with a first AFSM having two inputs and five states, a second AFSM having thirty inputs and fifty states, and a third AFSM having fifty inputs and one hundred states, the total number of test patterns to provide test coverage for the first AFSM, the second AFSM, and the third AFSM, is ten, one-thousand, and five-thousand, respectively. In the case of the single long scan chain, the test time equals 410,000 number of clocks, which is calculated using the equation: $5,000 \times (2+30+50) = 410,000$. In the case of the single input, multi-scan chain architecture proposed in the present disclosure, the test time equals 280,020 number of clocks, which is calculated using the equation: $2 \times 10 + 30 \times 1,000 + 50 \times 5,000 = 280,020$. Thus, the proposed test architecture provides a test time reduction of approximately thirty percent compared to the single long scan chain.

Figure 8:
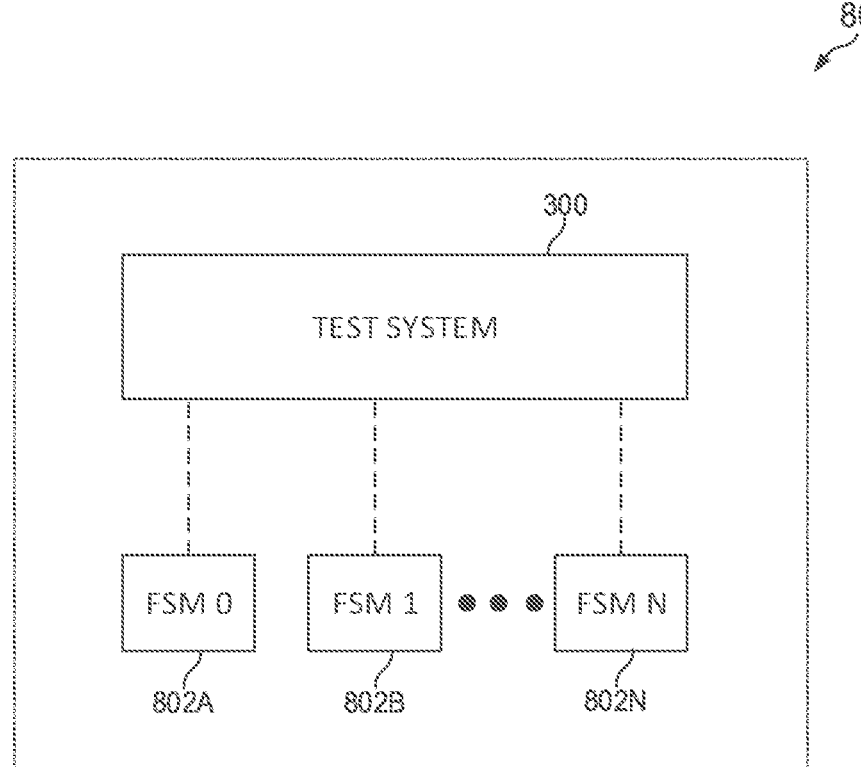
FIG. 8 is a block diagram of a device.

FIG. 8 illustrates a block diagram of a device 800. Device 800 includes test system 300 and multiple finite state machine circuits 802A-N, which may (or may not) be arranged as shown. Device 800 may include additional components, such as a processor, memory, and interface circuits. One or more of the finite state machine circuits 802A-N is an asynchronous finite state machine circuit in embodiments.

In embodiments, the finite state machine circuits 802A-N of the device 800 are used to control the state flow and sequencing. In embodiments, the finite state machine circuits 802A-N of the device 800 are implemented in memory modules or disk controllers. In embodiments, the finite state machine circuits 802A-N of the device 800 are used to decode communication protocols and parse and interpret data according to the protocol's rules. In embodiments, finite state machine circuits 802A-N of the device 800 are used in designing event-driven systems such as user interfaces, where input responses may need to be processed independently of a clock signal. In embodiments, finite state machine circuits 802A-N of the device 800 are used in power management circuits, like voltage regulators, power-on sequences in SOCs, etc. In embodiments, finite state machine circuits 802A-N of the device 800 are implemented in design systems that require reactions to environmental changes that might occur at unpredictable intervals.

It is noted that all steps outlined in the flow charts of the method are not necessarily required and can be optional. Further, changes to the arrangement of the steps, removal of one or more steps and path connections, and addition of steps and path connections are similarly contemplated.

A first aspect relates to a test system for serially testing N number of finite state machine circuits using N number of scan chains, where N is an integer greater than one. Each scan chain is coupled to a finite state machine circuit to test the finite state machine circuit coupled thereto. Each scan chain has M number of input terminals and one output terminal, where M is an integer greater than one. The test system includes a dispatcher input interface having M number of input terminals and N sets of output terminals, where each of the N set of output terminals includes M number of output terminals coupled to the M number of input terminals of an associated scan chain. The test system further includes a dispatcher output interface with N number of input terminals and one output terminal. The output terminal of each scan chain is coupled to one of the N number of input terminals of the dispatcher output interface.

In a first implementation form of the test system according to the first aspect as such, the dispatcher input interface is configured to receive two or more consecutive logic level low shift enable signals or reset signals to initiate the configuration of the dispatcher input interface; receive a test input signal indicating the scan chain to be selected for testing the finite state machine circuit coupled to the scan chain; and receive one or more logic level high shift enable signals or reset signals to end the configuration of the dispatcher input interface.

In a second implementation form of the test system according to the first aspect as such or any preceding implementation form of the first aspect, the dispatcher input interface is configured to forward scan signals for testing the finite state machine circuit coupled to the selected scan chain during the configuration of the dispatcher input interface.

In a third implementation form of the test system according to the first aspect as such or any preceding implementation form of the first aspect, the dispatcher output interface is configured to receive an output signal corresponding to the result of the testing at the output terminal of the dispatcher output interface.

In a fourth implementation form of the test system according to the first aspect as such or any preceding implementation form of the first aspect, the dispatcher input interface includes a plurality of flip-flops arranged in series, wherein a data input of a first flip-flop receives the two or more consecutive logic level low shift enable signals or reset signals, an output of each flip-flop other than a last flip-flop being coupled to a data input of a next flip-flop, a clock terminal of each flip-flop coupled to a clock signal; a first AND gate having inverted inputs, each inverted input of the first AND gate coupled to an output of one of the plurality of flip-flops; a second AND gate having a first input coupled to an output of the first AND gate, a second input of the second AND gate receiving the test input signal; a third AND gate having a first input coupled to the output of the first AND gate, a second input of the third AND gate receiving the clock signal; a third flip-flop having a data input coupled to an output of the second AND gate, a clock terminal of the third flip-flop coupled to an output of the third AND gate; an encoder circuit having an input coupled to an output of the third flip-flop, the encoder circuit configured to forwarding the scan chain signals for testing the finite state machine circuit coupled to the selected scan chain based on a signal at the input of the encoder circuit, wherein the encoder circuit disables the forwarding of the scan chain signals for other scan chains not under test; a fourth AND gate having a first inverted input coupled to the output of the first AND gate, a second input of the fourth AND gate receiving the test input signal; and a demultiplexer having an input coupled to an output of the fourth AND gate, a selection terminal of the demultiplexer coupled to the output of the third flip-flop, an output of the demultiplexer coupled to a test input of a corresponding scan chain of the M number of scan chains.

In a fifth implementation form of the test system according to the first aspect as such or any preceding implementation form of the first aspect, the dispatcher output interface includes a multiplexer. The input terminals of the multiplexer are coupled to an output of a scan chain. The multiplexer feeds an output signal from a scan chain under test to an output terminal of the multiplexer. The output signal is compared to an expected value to determine a status of the finite state machine circuit coupled to the scan chain under test.

In a sixth implementation form of the test system according to the first aspect as such or any preceding implementation form of the first aspect, the finite state machine circuits are asynchronous.

A second aspect relates to a method for serially testing N number of finite state machine circuits using N number of scan chains, where N is an integer greater than one, each scan chain coupled to a finite state machine circuit to test the finite state machine circuit coupled thereto. Each scan chain has M number of input terminals and one output terminal, where M is an integer greater than one. The method includes receiving two or more consecutive logic level low shift enable signals or reset signals to initiate a configuration of a dispatcher input interface. The dispatcher input interface has M number of input terminals and N sets of output terminals. Each of the N set of output terminals having M number of output terminals coupled to the M number of input terminals of an associated scan chain. The method further includes receiving a test input signal indicating the scan chain to be selected for testing the finite state machine circuit coupled to the scan chain; and receiving one or more logic level high shift enable signals or reset signals to end the configuration of the dispatcher input interface.

In a first implementation form of the method according to the second aspect as such, the method further includes receiving an output signal corresponding to the result of the testing at an output terminal of a dispatcher output interface. The dispatcher output interface having N number of input terminals and one output terminal, wherein the output terminal of each scan chain is coupled to one of the N number of input terminals of the dispatcher output interface.

In a second implementation form of the method according to the second aspect as such or any preceding implementation form of the second aspect, the method further includes forwarding scan signals, by the dispatcher input interface, for testing a finite state machine circuit coupled to the selected scan chain during the configuration of the dispatcher input interface.

In a third implementation form of the method according to the second aspect as such or any preceding implementation form of the second aspect, an output of each scan chain is coupled to a dispatcher output interface. The dispatcher output interface includes a multiplexer. The input terminals of the multiplexer are coupled to an output of a scan chain. The method further includes feeding, by the multiplexer, an output signal from a scan chain under test to an output terminal of the multiplexer; and comparing the output signal to an expected value to determine a status of a finite state machine circuit coupled to the scan chain under test.

In a fourth implementation form of the method according to the second aspect as such or any preceding implementation form of the second aspect, the dispatcher input interface includes a plurality of flip-flops arranged in series, wherein a data input of a first flip-flop receives the two or more consecutive logic level low shift enable signals or reset signals, an output of each flip-flop other than a last flip-flop being coupled to a data input of a next flip-flop, a clock terminal of each flip-flop coupled to a clock signal; a first AND gate having inverted inputs, each inverted input of the first AND gate coupled to an output of one of the plurality of flip-flops; a second AND gate having a first input coupled to an output of the first AND gate, a second input of the second AND gate receiving the test input signal; a third AND gate having a first input coupled to the output of the first AND gate, a second input of the third AND gate receiving the clock signal; a third flip-flop having a data input coupled to an output of the second AND gate, a clock terminal of the third flip-flop coupled to an output of the third AND gate; an encoder circuit having an input coupled to an output of the third flip-flop; a fourth AND gate having a first inverted input coupled to the output of the first AND gate, a second input of the fourth AND gate receiving the test input signal; and a demultiplexer having an input coupled to an output of the fourth AND gate, a selection terminal of the demultiplexer coupled to the output of the third flip-flop, an output of the demultiplexer coupled to a test input of a corresponding scan chain of the M number of scan chains.

In a fifth implementation form of the method according to the second aspect as such or any preceding implementation form of the second aspect, the method further includes forwarding, by the encoder circuit, the scan chain signals for testing a finite state machine circuit coupled to the selected scan chain based on a signal at the input of the encoder circuit, wherein the encoder circuit disables the forwarding of the scan chain signals for other scan chains not under test.

In a sixth implementation form of the method according to the second aspect as such or any preceding implementation form of the second aspect, the finite state machine circuits are asynchronous.

A third aspect relates to a device. The device includes N number of asynchronous finite state machine circuits, where N is an integer greater than one; and N number of scan chains, each scan chain coupled to an asynchronous finite state machine circuit to test the asynchronous finite state machine circuit coupled thereto. Each scan chain has M number of input terminals and one output terminal, where M is an integer greater than one. The device includes a dispatcher input interface with M number of input terminals and N sets of output terminals. Each of the N set of output terminals has M number of output terminals coupled to the M number of input terminals of an associated scan chain. The device further includes a dispatcher output interface having N number of input terminals and one output terminal. The output terminal of each scan chain is coupled to one of the N number of input terminals of the dispatcher output interface.

In a first implementation form of the device according to the third aspect as such, the dispatcher input interface is configured to receive two or more consecutive logic level low shift enable signals or reset signals to initiate the configuration of the dispatcher input interface; receive a test input signal indicating the scan chain to be selected for testing an asynchronous finite state machine circuit coupled to the scan chain; and receive one or more logic level high shift enable signals or reset signals to end the configuration of the dispatcher input interface.

In a second implementation form of the device according to the third aspect as such or any preceding implementation form of the third aspect, the dispatcher input interface is configured to forward scan signals for testing the asynchronous finite state machine circuit coupled to the selected scan chain during the configuration of the dispatcher input interface.

In a third implementation form of the device according to the third aspect as such or any preceding implementation form of the third aspect, the dispatcher output interface is configured to receive an output signal corresponding to the result of the testing at the output terminal of the dispatcher output interface.

In a fourth implementation form of the device according to the third aspect as such or any preceding implementation form of the third aspect, the dispatcher input interface comprises a plurality of flip-flops arranged in series, wherein a data input of a first flip-flop receives the two or more consecutive logic level low shift enable signals or reset signals, an output of each flip-flop other than a last flip-flop being coupled to a data input of a next flip-flop, a clock terminal of each flip-flop coupled to a clock signal; a first AND gate having inverted inputs, each inverted input of the first AND gate coupled to an output of one of the plurality of flip-flops; a second AND gate having a first input coupled to an output of the first AND gate, a second input of the second AND gate receiving the test input signal; a third AND gate having a first input coupled to the output of the first AND gate, a second input of the third AND gate receiving the clock signal; a third flip-flop having a data input coupled to an output of the second AND gate, a clock terminal of the third flip-flop coupled to an output of the third AND gate; an encoder circuit having an input coupled to an output of the third flip-flop, the encoder circuit configured to: forward the scan chain signals for testing an asynchronous finite state machine circuit coupled to the selected scan chain based on a signal at the input of the encoder circuit, wherein the encoder circuit disables the forwarding of the scan chain signals for other scan chains not under test; a fourth AND gate having a first inverted input coupled to the output of the first AND gate, a second input of the fourth AND gate receiving the test input signal; and a demultiplexer having an input coupled to an output of the fourth AND gate, a selection terminal of the demultiplexer coupled to the output of the third flip-flop, an output of the demultiplexer coupled to a test input of a corresponding scan chain of the M number of scan chains.

In a fifth implementation form of the device according to the third aspect as such or any preceding implementation form of the third aspect, the dispatcher output interface includes a multiplexer. The input terminals of the multiplexer are coupled to an output of a scan chain. The multiplexer feeds an output signal from a scan chain under test to an output terminal of the multiplexer. The output signal is compared to an expected value to determine a status of an asynchronous finite state machine circuit coupled to the scan chain under test.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A test system for serially testing N number of finite state machine circuits using N number of scan chains, where N is an integer greater than one, each scan chain coupled to a finite state machine circuit to test the finite state machine circuit coupled thereto, each scan chain having M number of input terminals and one output terminal, where M is an integer greater than one, the test system comprising:
   a dispatcher input interface comprising:
      a plurality of flip-flops arranged in series, wherein an output of each flip-flop other than a last flip-flop is coupled to a data input of a next flip-flop and a clock terminal of each flip-flop is coupled to a clock signal, wherein the plurality of flip-flops is configured to detect two or more consecutive logic level low shift enable signals or reset signals to initiate a configu-
ration mode of the dispatcher input interface,
a plurality of AND gates coupled to each other and the
plurality of flip-flops, wherein the plurality of AND
gates is configured to generate a dispatch enable
signal based on outputs of the plurality of the flip-
flops, the dispatch enable signal indicating entry into
the configuration mode,
M number of input terminals, and
N sets of output terminals, each of the N sets of output
terminals comprising M number of output terminals
coupled to the M number of input terminals of an
associated scan chain; and
a dispatcher output interface having N number of input
terminals and one output terminal, wherein the output
terminal of each scan chain is coupled to one of the N
number of input terminals of the dispatcher output
interface.

2. The test system of claim 1, wherein the dispatcher input
interface is configured to:
receive a test input signal indicating the scan chain to be
selected for testing the finite state machine circuit
coupled to the scan chain; and
receive one or more logic level high shift enable signals
or reset signals to end the configuration mode of the
dispatcher input interface.

3. The test system of claim 2, wherein the dispatcher input
interface is configured to:
forward scan signals for testing the finite state machine
circuit coupled to the selected scan chain during the
configuration mode of the dispatcher input interface.

4. The test system of claim 3, wherein the dispatcher
output interface is configured to receive an output signal
corresponding to the result of the testing at the output
terminal of the dispatcher output interface.

5. The test system of claim 3, wherein, in the plurality of
flip-flops, a data input of a first flip-flop receives the two or
more consecutive logic level low shift enable signals or reset
signals, wherein the plurality of AND gates comprises:
a first AND gate having inverted inputs, each inverted
input of the first AND gate coupled to an output of one
of the plurality of flip-flops;
a second AND gate having a first input coupled to an
output of the first AND gate, a second input of the
second AND gate receiving the test input signal;
a third AND gate having a first input coupled to the output
of the first AND gate, a second input of the third AND
gate receiving the clock signal; and
a fourth AND gate having a first inverted input coupled to
the output of the first AND gate, a second input of the
fourth AND gate receiving the test input signal,
wherein the dispatcher input interface comprises:
a third flip-flop having a data input coupled to an output
of the second AND gate, a clock terminal of the third
flip-flop coupled to an output of the third AND gate;
an encoder circuit having an input coupled to an output
of the third flip-flop, the encoder circuit configured
to forward the scan chain signals for testing the finite
state machine circuit coupled to the selected scan
chain based on a signal at the input of the encoder
circuit, wherein the encoder circuit disables the for-
warding of the scan chain signals for other scan
chains not under test; and
a demultiplexer having an input coupled to an output of
the fourth AND gate, a selection terminal of the
demultiplexer coupled to the output of the third flip-flop, an output of the demultiplexer coupled to a
test input of a corresponding scan chain of M number
of scan chains.

6. The test system of claim 1, wherein the dispatcher
output interface comprises a multiplexer, wherein input
terminals of the multiplexer are coupled to an output of a
scan chain, wherein the multiplexer feeds an output signal
from a scan chain under test to an output terminal of the
multiplexer, and wherein the output signal is compared to an
expected value to determine a status of the finite state
machine circuit coupled to the scan chain under test.

7. The test system of claim 1, wherein the finite state
machine circuits are asynchronous.

8. A method for serially testing N number of finite state
machine circuits using N number of scan chains, where N is
an integer greater than one, each scan chain coupled to a
finite state machine circuit to test the finite state machine
circuit coupled thereto, each scan chain having M number of
input terminals and one output terminal, where M is an
integer greater than one, the method comprising:
receiving two or more consecutive logic level low shift
enable signals or reset signals to initiate a configuration
mode of a dispatcher input interface, the dispatcher
input interface comprising:
a plurality of flip-flops arranged in series, wherein an
output of each flip-flop other than a last flip-flop is
coupled to a data input of a next flip-flop and a clock
terminal of each flip-flop is coupled to a clock signal,
wherein the plurality of flip-flops is configured to
detect two or more consecutive logic level low shift
enable signals or reset signals to initiate a configu-
ration mode of the dispatcher input interface,
a plurality of AND gates coupled to each other and the
plurality of flip-flops, wherein the plurality of AND
gates is configured to generate a dispatch enable
signal based on outputs of the plurality of the flip-
flops, the dispatch enable signal indicating entry into
the configuration mode,
M number of input terminals, and
N sets of output terminals, each of the N sets of output
terminals comprising M number of output terminals
coupled to the M number of input terminals of an
associated scan chain;
receiving a test input signal indicating the scan chain to be
selected for testing the finite state machine circuit
coupled to the scan chain; and
receiving one or more logic level high shift enable signals
or reset signals to end the configuration mode of the
dispatcher input interface.

9. The method of claim 8, further comprising receiving an
output signal corresponding to the result of the testing at an
output terminal of a dispatcher output interface, the dis-
patcher output interface having N number of input terminals
and one output terminal, wherein the output terminal of each
scan chain is coupled to one of the N number of input
terminals of the dispatcher output interface.

10. The method of claim 8, further comprising forwarding
scan signals, by the dispatcher input interface, for testing a
finite state machine circuit coupled to the selected scan chain
during the configuration mode of the dispatcher input inter-
face.

11. The method of claim 8, wherein an output of each scan
chain is coupled to a dispatcher output interface, the dis-
patcher output interface comprising a multiplexer, wherein
input terminals of the multiplexer are coupled to an output
of a scan chain, the method further comprising:

feeding, by the multiplexer, an output signal from a scan chain under test to an output terminal of the multiplexer; and comparing the output signal to an expected value to determine a status of the finite state machine circuit coupled to the scan chain under test.

12. The method of claim 8, wherein, in the plurality of flip-flops, a data input of a first flip-flop receives the two or more consecutive logic level low shift enable signals or reset signals, wherein the plurality of AND gates comprises:

a first AND gate having inverted inputs, each inverted input of the first AND gate coupled to an output of one of the plurality of flip-flops;

a second AND gate having a first input coupled to an output of the first AND gate, a second input of the second AND gate receiving the test input signal;

a third AND gate having a first input coupled to the output of the first AND gate, a second input of the third AND gate receiving the clock signal; and a fourth AND gate having a first inverted input coupled to the output of the first AND gate, a second input of the fourth AND gate receiving the test input signal, wherein the dispatcher input interface comprises:

a third flip-flop having a data input coupled to an output of the second AND gate, a clock terminal of the third flip-flop coupled to an output of the third AND gate;

an encoder circuit having an input coupled to an output of the third flip-flop; and a demultiplexer having an input coupled to an output of the fourth AND gate, a selection terminal of the demultiplexer coupled to the output of the third flip-flop, an output of the demultiplexer coupled to a test input of a corresponding scan chain of M number of scan chains.

13. The method of claim 12, further comprising forwarding, by the encoder circuit, scan chain signals for testing the finite state machine circuit coupled to the selected scan chain based on a signal at the input of the encoder circuit, wherein the encoder circuit disables the forwarding of the scan chain signals for other scan chains not under test.

14. The method of claim 8, wherein the finite state machine circuits are asynchronous.

15. A device, comprising:

N number of asynchronous finite state machine circuits, where N is an integer greater than one;

N number of scan chains, each scan chain coupled to an asynchronous finite state machine circuit to test the asynchronous finite state machine circuit coupled thereto, each scan chain having M number of input terminals and one output terminal, where M is an integer greater than one;

a dispatcher input interface comprising:

a plurality of flip-flops arranged in series, wherein an output of each flip-flop other than a last flip-flop is coupled to a data input of a next flip-flop and a clock terminal of each flip-flop is coupled to a clock signal, wherein the plurality of flip-flops is configured to detect two or more consecutive logic level low shift enable signals or reset signals to initiate a configuration mode of the dispatcher input interface, a plurality of AND gates coupled to each other and the plurality of flip-flops, wherein the plurality of AND gates is configured to generate a dispatch enable signal based on outputs of the plurality of the flip-flops, the dispatch enable signal indicating entry into the configuration mode, M number of input terminals, and N sets of output terminals, each of the N sets of output terminals comprising M number of output terminals coupled to the M number of input terminals of an associated scan chain; and a dispatcher output interface having N number of input terminals and one output terminal, wherein the output terminal of each scan chain is coupled to one of the N number of input terminals of the dispatcher output interface.

16. The device of claim 15, wherein the dispatcher input interface is configured to:

receive a test input signal indicating the scan chain to be selected for testing the asynchronous finite state machine circuit coupled to the scan chain; and receive one or more logic level high shift enable signals or reset signals to end the configuration mode of the dispatcher input interface.

17. The device of claim 16, wherein the dispatcher input interface is configured to:

forward scan signals for testing the asynchronous finite state machine circuit coupled to the selected scan chain during the configuration mode of the dispatcher input interface.

18. The device of claim 17, wherein the dispatcher output interface is configured to receive an output signal corresponding to the result of the testing at the output terminal of the dispatcher output interface.

19. The device of claim 18, wherein, in the plurality of flip-flops, a data input of a first flip-flop receives the two or more consecutive logic level low shift enable signals or reset signals, wherein the plurality of AND gates comprises:

a first AND gate having inverted inputs, each inverted input of the first AND gate coupled to an output of one of the plurality of flip-flops;

a second AND gate having a first input coupled to an output of the first AND gate, a second input of the second AND gate receiving the test input signal;

a third AND gate having a first input coupled to the output of the first AND gate, a second input of the third AND gate receiving the clock signal; and a fourth AND gate having a first inverted input coupled to the output of the first AND gate, a second input of the fourth AND gate receiving the test input signal, wherein the dispatcher input interface comprises:

a third flip-flop having a data input coupled to an output of the second AND gate, a clock terminal of the third flip-flop coupled to an output of the third AND gate;

an encoder circuit having an input coupled to an output of the third flip-flop, the encoder circuit configured to forward the scan chain signals for testing the asynchronous finite state machine circuit coupled to the selected scan chain based on a signal at the input of the encoder circuit, wherein the encoder circuit disables the forwarding of the scan chain signals for other scan chains not under test; and a demultiplexer having an input coupled to an output of the fourth AND gate, a selection terminal of the demultiplexer coupled to the output of the third flip-flop, an output of the demultiplexer coupled to a test input of a corresponding scan chain of M number of scan chains.

20. The device of claim 19, wherein the dispatcher output interface comprises a multiplexer, wherein input terminals of the multiplexer are coupled to an output of a scan chain, wherein the multiplexer feeds an output signal from a scan chain under test to an output terminal of the multiplexer, and wherein the output signal is compared to an expected value to determine a status of the asynchronous finite state machine circuit coupled to the scan chain under test.

* * * * *